(12) United States Patent
Choi

(10) Patent No.: US 9,401,453 B2
(45) Date of Patent: Jul. 26, 2016

(54) WHITE NANOLED WITHOUT REQUIRING COLOR CONVERSION

(71) Applicant: THE UNIVERSITY OF HONG KONG, Hong Kong (CN)

(72) Inventor: Hoi Wai Choi, Hong Kong (CN)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 202 days.

(21) Appl. No.: 13/902,073

(22) Filed: May 24, 2013

(65) Prior Publication Data

US 2013/0313517 A1 Nov. 28, 2013

Related U.S. Application Data

(60) Provisional application No. 61/651,362, filed on May 24, 2012.

(51) Int. Cl.
*H01L 33/08* (2010.01)
*H01L 33/18* (2010.01)
*H01L 33/12* (2010.01)

(52) U.S. Cl.
CPC ............... *H01L 33/08* (2013.01); *H01L 33/18* (2013.01); *H01L 33/12* (2013.01)

(58) Field of Classification Search
CPC ................................ H01L 33/08; H01L 33/18
See application file for complete search history.

(56) References Cited

U.S. PATENT DOCUMENTS

| 2011/0291072 A1* | 12/2011 | Kim | H01L 33/08 257/13 |
| 2014/0217361 A1* | 8/2014 | Seong | H01L 27/156 257/13 |

* cited by examiner

*Primary Examiner* — Long Pham
(74) *Attorney, Agent, or Firm* — Saliwanchik, Lloyd & Eisenschenk

(57) ABSTRACT

A nano-LED containing an array of nano-pillars of different diameters that are distributed over an emission area of an LED chip is capable of emitting broadband and white or nearly white light. Since each pillar emits light at a different wavelength according to its diameter and strain state, the overall emission spectral characteristics of the device is a combination of individual spectrum, giving rise to broadband emission. The spectral shape can be tailored for different shades of white emission, by controlling the distribution of the different diameter nano-pillars. The nano-pillars are patterned by nanosphere lithography.

24 Claims, 6 Drawing Sheets

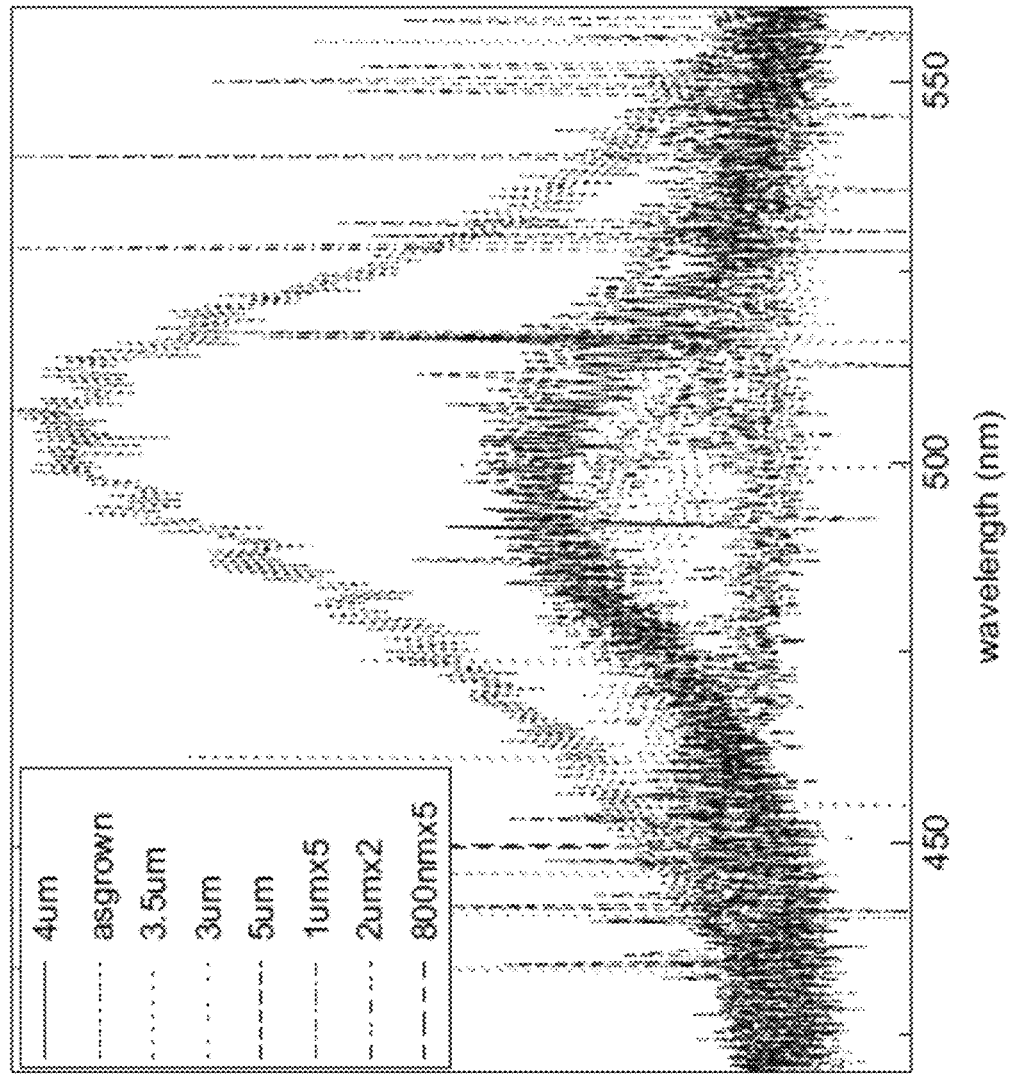

WHITE NANOLED WITHOUT REQUIRING COLOR CONVERSION

CROSS-REFERENCE TO RELATED APPLICATION

This application claims the benefit of U.S. Provisional Application Ser. No. 61/651,362, filed May 24, 2012, which is hereby incorporated by reference in its entirety.

FIELD OF THE INVENTION

The subject matter disclosed herein relates to light emitting diode (LED) devices.

BACKGROUND

LEDs are optoelectronic devices, which emit light by recombining injected electrons and holes radiatively. Depending on a bandgap of active material in a particular optoelectronic device, LEDs can emit at a wide range of wavelengths from ultraviolet to infrared. However, the wavelengths of light which are of major interest are those in the visible region. LEDs emitting in the visible spectrum (typically from ~400 nm (purple) to ~700 nm (red)) are visible to the human eye and are thus useful for illumination purposes. LEDs that emit visible light are also useful for providing visible indicators.

In order to emit light at visible wavelengths, many LEDs are constructed using elements from group III and V of the Periodic Table. Three (3) of these elements are gallium (Ga), indium (In) and nitrogen (N). Such materials are doped with "impurities," small quantities of materials selected from other columns of the periodic table, to allow electrical activity, which in turn generates light via the recombination of an electron from a conducting state to a valence state.

The devices above are referred to as being of the (In,Ga) N material group. LEDs fabricated from this group of materials include monochromatic LEDs, which emit with single spectral peak and a narrow linewidth (e.g., ~30 nm). LEDs fabricated using the (In,Ga) N material system can be made to emit monochromatic light ranging from ~380 nm (near UV) to ~580 nm (i.e., green) by changing the indium composition in the material system. Monochromatic LEDs, are often used as light indicators, where only a single color is required.

Pure white light, on the other hand, is broadband, i.e., a polychromatic light. It cannot be generated directly with a single LED. However, if an LED can be made to generate light at several discrete wavelengths or several relatively continuous bands of wavelengths, the resultant spectrum may nevertheless be considered polychromatic and the light emitted from such an LED will appear to the human eye to be white.

For illumination purposes, white light is generally preferred over non-white light. As lighting devices, LEDs are superior to incandescent lamps and fluorescent tubes, in terms of luminous efficiency, lifetime, robustness and environmental friendliness.

Currently, there are two major or principal methods of making broadband LED light sources. The first method makes use of phosphors for "color down" conversion. Phosphorescent materials that emit light when exposed to certain wavelengths of radiation are traditionally used for color conversion in light-emitting diodes (LEDs). A device may emit a high-energy photon, and the phosphor may absorb it and then re-emit a lower-energy and thus differently colored photon. Such phosphors absorb shorter-wavelength photons and re-emit longer wavelength photons. For white light emission, green and red light-emitting phosphors may be used. It should be observed that any form of color conversion involves energy losses. While green phosphors may have quantum efficiencies of up to 90%, quantum efficiencies of red phosphors are typically limited to around 40%. This, in turn, translates to low wall-plug efficiency.

In such color down conversion schemes, a shorter wavelength monochromatic LED, such as an InGaN LED emitting at 460 nm (blue), may be used as a excitation light source. Such light may be used to excite luminescence in phosphors emitting at longer wavelengths, such as green and red. A resultant light is comprised of components from different parts of the visible spectrum, and is thus considered broadband light. Since the phosphor particles are small (e.g., on a nanometer scale) and indistinguishable to the naked eye, the emitted light appears as white if the proportions of the different colors are right. This form of white light generation is similar to that employed in fluorescent tubes.

However, there are many drawbacks associated with phosphors, including limited lifetime, Stokes-wave energy loss, low reliability and low luminous efficiency.

Another method of making a broadband LED light source is to mount several discrete LED chips onto a single package, each of which emits a different color. These devices are often called multi-chip LEDs, where LEDs emitting at the primary colors of light (i.e., blue, green and red) are mounted onto a single package. However, true "white" light emission cannot be achieved using this technique. Each LED chip is typically over 100 microns in dimension, while the separation of LED chips is of the same order. As a result, the colors are not homogenized and therefore appear as discrete colors to the naked eye unless placed at very far distances, by which time an LED's intensity has dropped immensely.

BRIEF SUMMARY

Embodiments of the subject invention provide methods and systems that can be used to utilize and manufacture a solid-state light source comprising an ensemble of nano-scale structures embedded within the active region of an LED. Processes of manufacturing the same are also provided. Such a solid-state light source can be capable of emitting polychromatic or substantially polychromatic light. Such an LED device can include an array of nano-scale pillar structures with a continuum of diameters, i.e., varying diameters, fabricated via a top-down technique. Each nano-scale pillar structure having a particular diameter or within a diameter range emits light at a slightly different wavelength than other nano-scale pillar structures with other diameters or diameter ranges.

In an embodiment, a semiconductor light-emitting diode can include a light-emitting region, and the light-emitting region can include an array of non-uniformly-sized nano-pillars. The nano-pillars can be formed using a top-down approach.

In an embodiment, nanosphere lithography can be used to nano-pattern a nano-LED as described herein. A nanosphere coating, which can serve as a lithographic mask for pattern transfer to form nano-pillars, can be prepared by mixing various nanosphere colloidal solutions and subsequently coating a solution onto the LED surface.

BRIEF DESCRIPTION OF THE FIGURES

Non-limiting and non-exhaustive aspects are described with reference to the following figures, wherein like reference numerals refer to like parts throughout the various figures unless otherwise specified.

FIG. 6 shows a plot of emission wavelength for nano-pillars with a range of diameters of between 800 nm to 4 µm.

DETAILED DESCRIPTION

Figure 1:
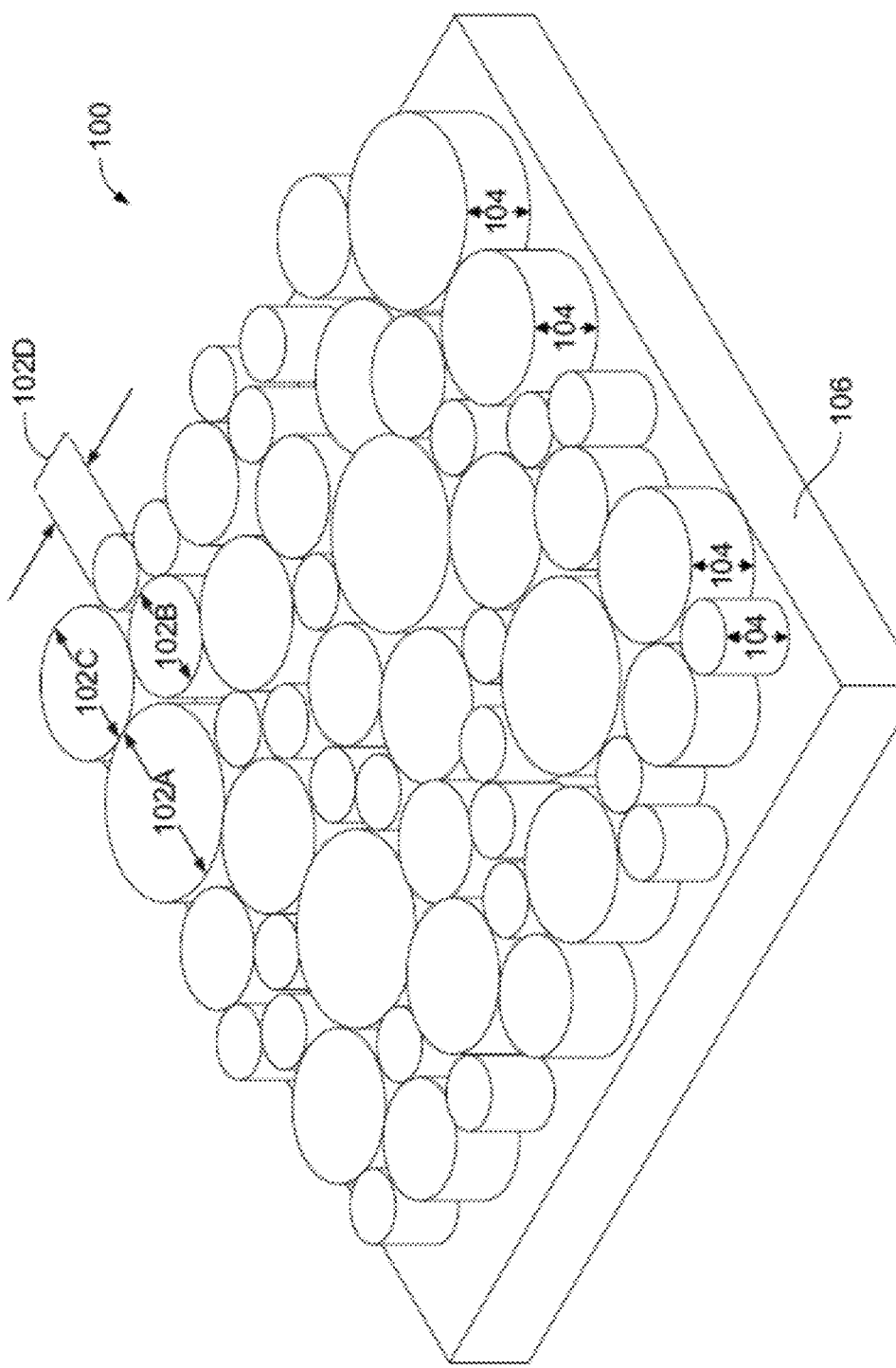
FIG. 1 is a perspective view of a nanostructured LED surface comprising an ensemble of pillar structures having different diameters but substantially similar heights.

Embodiments of the subject invention provide methods and systems that can be used to utilize and manufacture a solid-state light source comprising an ensemble of nano-scale structures embedded within the active region of an LED. Processes of manufacturing the same are also provided. Such a solid-state light source can be capable of emitting polychromatic or substantially polychromatic light. Such an LED device can include an array of nano-scale pillar structures with a continuum of diameters, i.e., varying diameters, fabricated via a top-down technique. Each nano-scale pillar structure having a particular diameter or within a diameter range emits light at a slightly different wavelength than other nano-scale pillar structures with other diameters or diameter ranges.

The dimensions of individual pillars are too small to be optically resolved by the human eye. Collectively, the active region comprising an ensemble of differently-sized nano-pillars emits a broadband spectrum of light corresponding to different shades of white light, with spectral contents which can be adjusted by varying the nano-pillar dimensions and densities.

The region responsible for radiative recombinations, or light-emitting active region of a nitride-based LED, can include multiple InGaN well GaN barrier quantum well structures, which are invariably compressively strained due to lattice mismatch between GaN and the substrate (e.g., a sapphire substrate), together with lattice mismatch between the well and barrier layers. An induced strain on an LED wafer is thus strongly dependent on the Indium (In) composition, which in turn determines the emission wavelength. With a higher In composition, the active region becomes more stained, whilst reducing the bandgap energy of the $In_xGa_{1-x}N$ alloy. Since the emission wavelength is inversely proportional to its bandgap energy, a longer wavelength InGaN/GaN emitter is invariably more strained than a shorter wavelength emitter based on the same material system.

Nano-structuring of InGaN/GaN quantum wells (QW) contribute to partial relaxation of strain, resulting in a spectral blue shift. In nanostructures, the atoms near the surface regions are not constrained by surrounding atoms, allowing a greater degree of atomic displacements. Based on studies involving top-down nano-patterning of nano-pillars by nanosphere lithography followed by plasma etching, it was discovered by the inventors that the extent of blue-shift, or strain relaxation, was strongly dependent on the nano-pillar diameter. The nano-pillars can be strain relaxed nano-pillars.

It was also discovered by the inventors that the extent of spectral shift does not depend on the physical dimensions alone; the wavelength of the wafer (associated with built-in strain of the QWs), together with the processing method (e.g., top-down vs. bottom up; type and energy of etching), can make a significant difference.

In an embodiment, nanosphere lithography (NSL) can be employed for nano-patterning of a nano-LED. The use of nanospheres has many distinct advantages, including but not limited to: (1) it is a low-cost self-assembly approach towards nanofabrication; (2) it is a parallel method of patterning, creating large areas at a time; (3) it is capable of producing closed-packed nano-features; (4) it allows dimension control with the use of differently-sized nanospheres; and (5) additional non-closed-packed patterns can be achieved by modifying the nanosphere pattern (by etching or otherwise) prior to pattern transfer.

In alternative embodiments, other nano-patterning techniques can be used, including but not limited to electron-beam lithography or nanoimprint lithography. Though, the throughput, flexibility, and cost may not be as competitive as with NSL.

In certain embodiments, the coating of a monolayer of differently-sized closed-pack nanospheres can be achieved by spin-coating, vertical deposition, or inkjet printing.

To achieve the widest possible spectral broadband emission, two factors are crucial: the target emission wavelength of the LED wafer should be as long as possible (e.g., ≥560 nm), and the extent of strain relaxation should be as large as possible. Wafers with such high In contents are invariably highly strained, and large spectral blue shifts can be expected through nano-structuring.

With strain relaxation, the internal quantum efficiencies of the QW LED will be higher compared with the strained QWs (i.e., compared with conventional LED devices). Additionally, the nanostructured surface would greatly enhance light extraction, so the overall device efficiency would be high (compared with conventional LED devices). Another added benefit of nano-pillar LEDs is their insensitivity to injection current, ensuring that the emission wavelength is maintained at all current levels. The starting LED should contain high In content InGaN/GaN QWs with center emission wavelength of larger than 540 nm.

In an embodiment, the internal quantum efficiencies of the QW LED can be any of the following values, about any of the following values, or at least any of the following values: 65%, 70%, 75%, 80%, 85%, 90%, or 95%. In an embodiment, the light extraction efficiencies of the QW LED can be any of the following values, about any of the following values, or at least any of the following values: 65%, 70%, 75%, 80%, 85%, 90%, or 95%.

FIG. 1 illustrates a nanostructured LED surface comprising an ensemble or group of pillar structures 100, having different diameters 102A-102D. Referring to FIG. 1, the nano-pillars 100 are non-uniformly-sized, such that they do not all have the same diameter. The pillar structures can be seen to be cylindrical or substantially cylindrical, and parallel or substantially parallel to each other. They can be formed on a substrate 106. In an embodiment, the substrate 106 is an LED wafer including a p-type GaN top contact layer, InGaN/GaN QWs, n-type GaN contact layer, and undoped GaN grown on a suitable substrate (e.g., sapphire, SiC, or Si).

The pillars have a height dimension 104. The height 104 of the several pillars is sufficiently tall so that the light-emitting InGaN/GaN quantum wells of the LED structure are embedded within the pillars. Being small, the ratio of pillar surface area to its volume becomes large. The atoms, particularly those on or near the surface region, are not constrained by surrounding atoms are have the freedom to be displaced, resulting in a relaxation of the built-in strain arising from lattice mismatched epitaxy.

Nanosphere lithography is a practical approach towards large-scale nano-patterning with the capability of forming 2-D and 3-D nanostructures. Uniform spheres are capable of self-assembling into ordered hexagonal arrays over large areas; such monolayers of nanospheres serve as excellent hard masks to transfer pillar patterns onto the surfaces of LEDs.

Nanospheres are spherical particles synthesized from a wide range of materials, including but not limited to oxides, metals, and polymers.

In a preferred embodiment, nanosphere lithography is used as a method of forming nano-pillars with different nano-pillars having different or varying diameters. For the purpose of achieving polychromatic emission, it was determined that the nano-pillar diameters should be in a range of between about 50 nm to about 500 nm. In many embodiments, the nanosphere is made from a hard material for high etch selectivity. Such hard materials include, but are not limited to, silica or alumina.

In many embodiments, a nanosphere coating, which serves as a lithographic mask for pattern transfer onto the LED wafer to form the nano-pillars, can be prepared by mixing various nanosphere colloidal solutions and subsequently coating a solution onto the LED surface. The coating can be applied to the nano-pillars via different methods.

In one embodiment, the nanosphere colloidal solution can be fed to the print head of an inkjet printer (e.g., a piezoelectric inkjet printer). The dispense rate and velocity can be accurately controlled through control of the voltage pulse and shape to the device, and the speed and path of the translation stage holding the sample.

In another embodiment, the nanosphere colloidal solution can be applied or formed by spin-coating. The colloidal suspension can then be dispensed onto the LED sample surface by mechanical micro-pipetting. The nanospheres spread laterally upon spin-coating at specific speeds and durations, which need to be optimized according to actual circumstances, self-assembling into a monolayer across the sample. At low spin speeds, the nanospheres aggregate into multiple layers, making them unsuitable for lithographic masking. Conversely, at excessively high spin speeds, the nanospheres are flung off the wafer. In a particular embodiment, spin-coating can be performed at 1000 rpm for 5 minutes, using 1.5 µL of colloidal suspension In another embodiment, vertical deposition can be used for assembly of the monolayer of differently-sized spheres. The wafer is immersed into the nanosphere solution by laying it upon the sidewall of a vial, which is then placed into an oven. The oven can be maintained at a constant temperature (e.g., 40° C.) and can have a stable supply of air stream for a period of time (e.g., 3 hours). The solution eventually evaporates, leaving the nanospheres self-assembled into a monolayer on the surface of the wafer.

Figure 2:
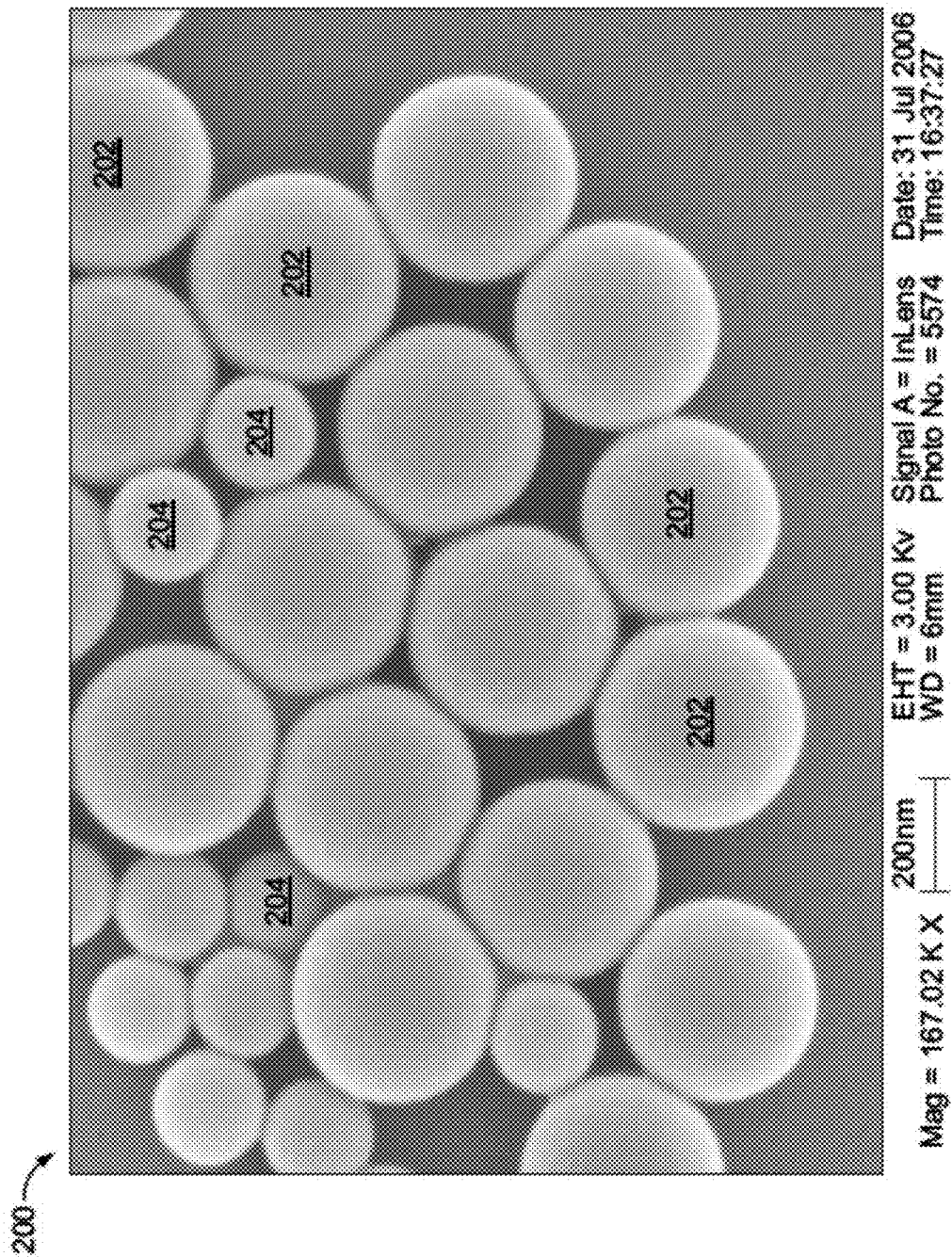
FIG. 2 illustrates nanospheres of two different diameters coated on top of an LED wafer.

FIG. 2 shows a plan view 200 of nanospheres 202, 204 of two different diameters coated on the p-GaN top surface of an LED wafer by spin-coating.

Figure 3:
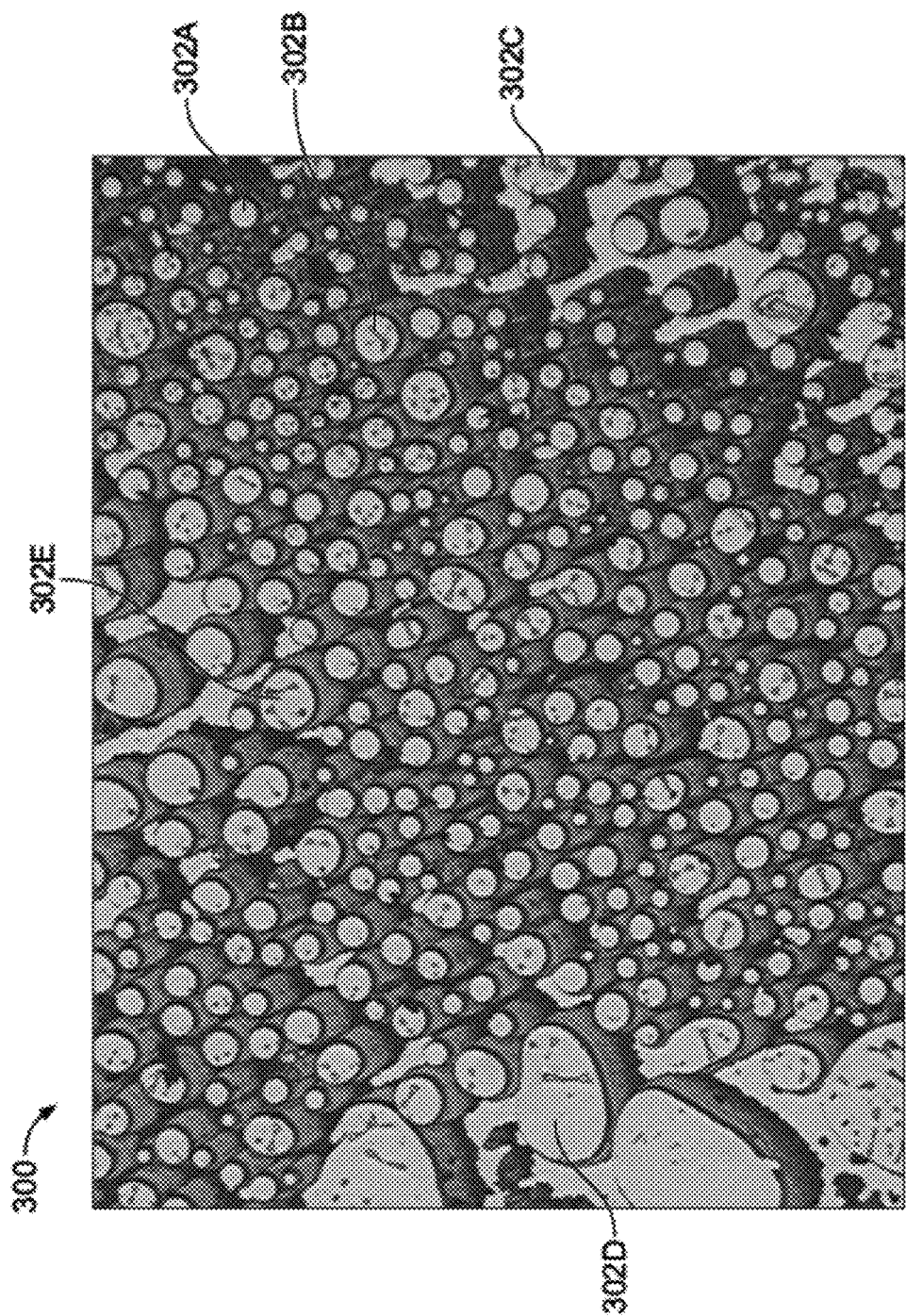
FIG. 3 illustrates nano-pillars with a range of diameters.

FIG. 3 illustrates nano-pillars 300 with a wide range of diameters 302A-302E. The pattern of nano-pillars shown in FIG. 3 was transferred from a nanosphere array whose dimensions roughly correspond to the nano-pillar dimensions shown in FIG. 2.

Figure 4:
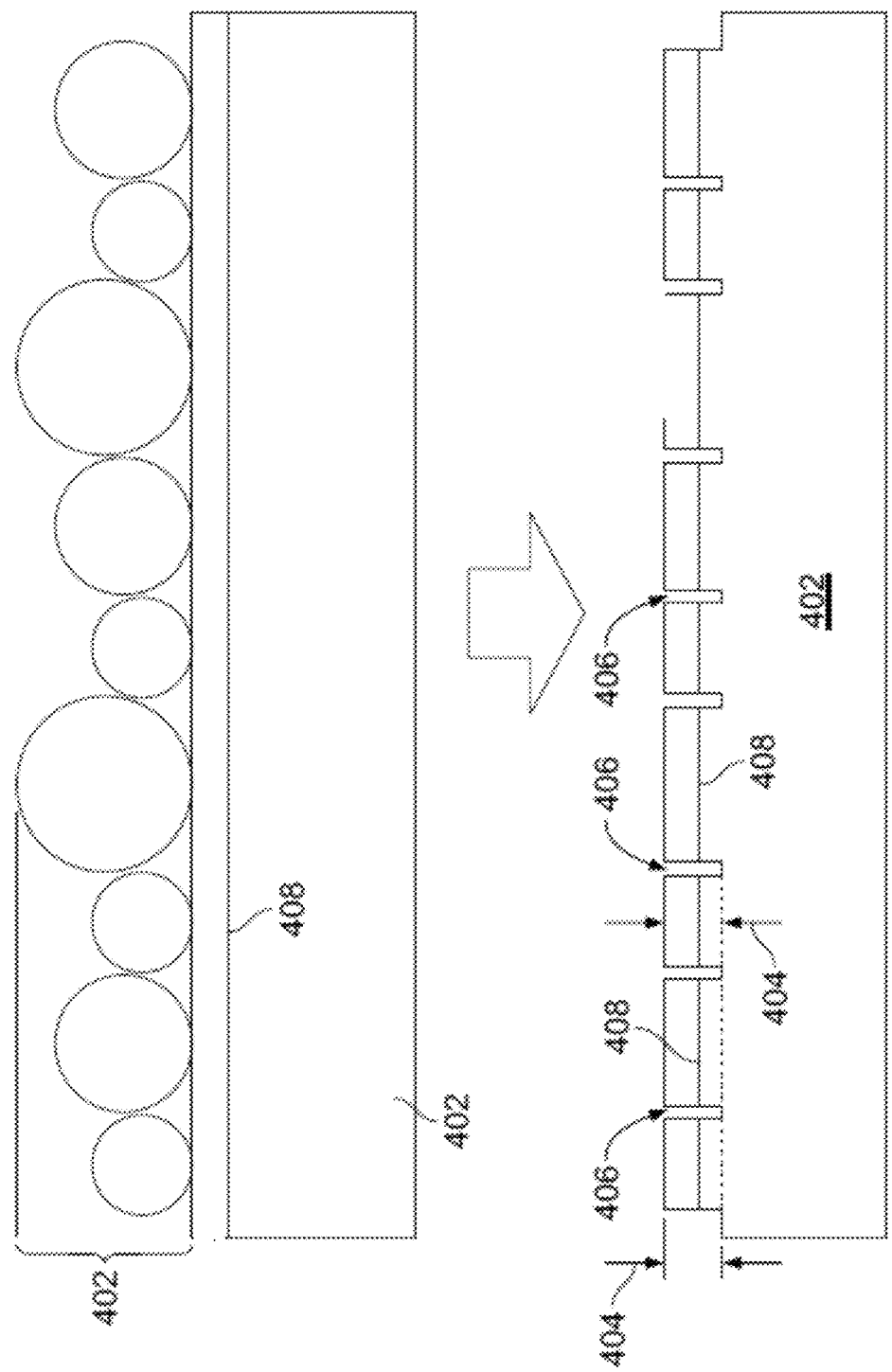
FIG. 4 illustrates transfer of a nanosphere pattern to an LED wafer.

FIG. 4 shows transfer of a nanosphere pattern to an LED wafer. Referring to FIG. 4, a nanosphere monolayer 402 can serve as a hard lithographic mask due to its etch resistance, whose pattern can be transferred to an LED wafer by dry etching, as shown in FIG. 4. The etch depth 404 should be chosen such that the etch 406 terminates on the n-doped GaN layer of the LED wafer beneath the InGaN/GaN QW layers 408, so that the MQWs are located within the pillars and an n-contact may subsequently be formed.

Transfer of the nanosphere pattern, as illustrated in FIG. 4, can be achieved by one of many ways of etching, including but not limited to plasma etching, ion etching, and laser etching. The aggressiveness of each approach varies, so that the extent of strain relaxation may be different, as extents of ion penetration into the lattice varies.

With the nano-pillars formed on the LED wafers, interconnection of p-GaN layers of individual pillars is important so that electrical injection to all pillars can take place simultaneously. This may be achieved via one of several methods.

In one embodiment, surface planarization, which makes use of a gap-filling material (e.g., spin-on-glass) to flatten the surface, can be performed, exposing the top p-contact region. An optically semi-transparent current-spreading layer such as indium-tin-oxide (ITO) or Ni/Au can electrically interconnect the pillars for electroluminescent operation.

In an embodiment, the use of transparent conducting ITO films can serve as this interconnection layer.

In another embodiment, the growth of a p-type GaN layer over the nano-pillars by epitaxial lateral overgrowth is can be used for planarization.

Figure 5:
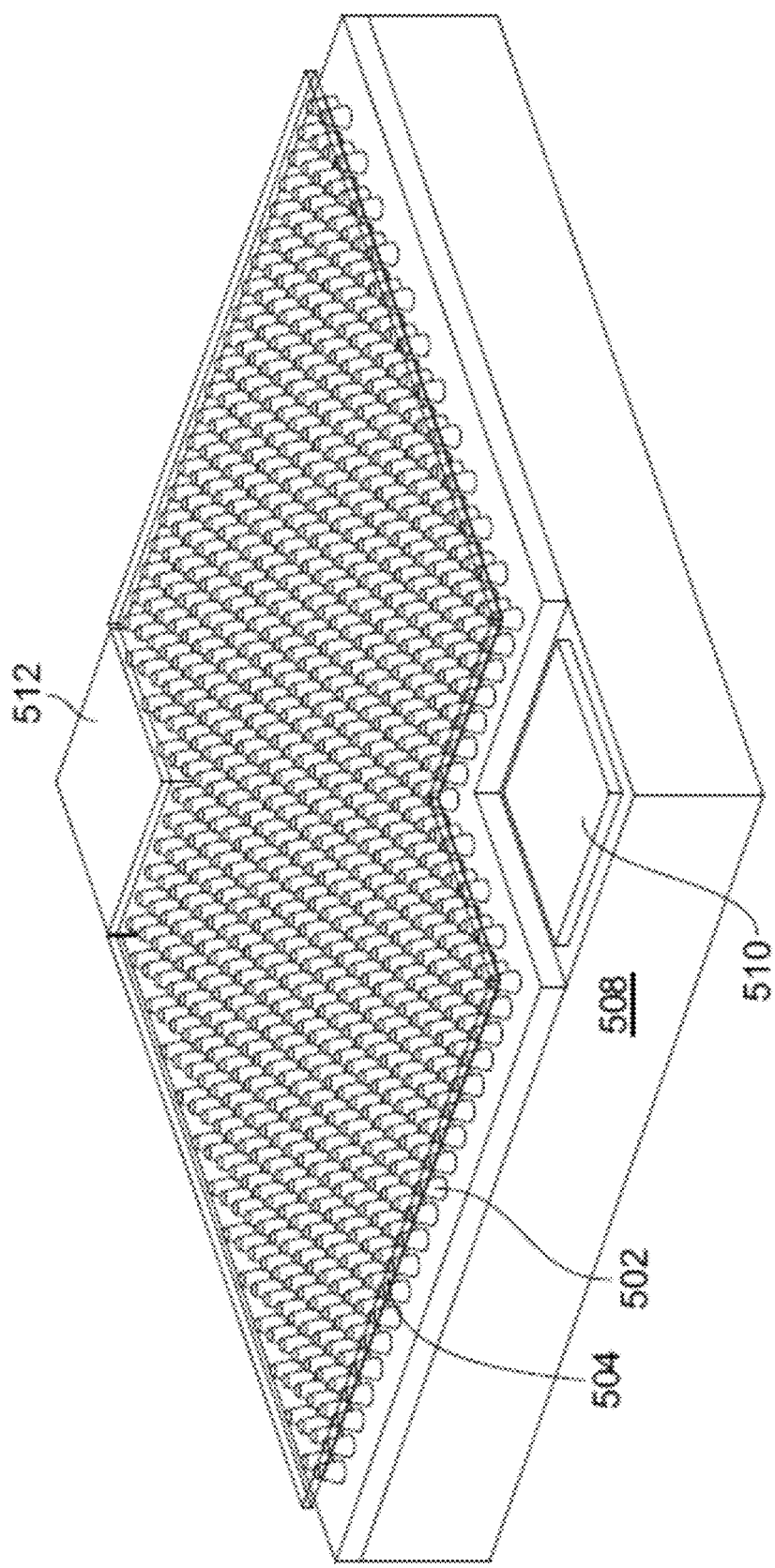
FIG. 5 shows an LED device containing a planarized array of nano-pillars, with electrodes.

The n-type and p-type electrodes can be defined and deposited to complete the device fabrication. The device is ready for electroluminescent operation at this stage. FIG. 5 illustrates one such device, containing a planarized array of nano-pillars 502 via the planarization layer 504, with both electrodes 510 and 512. The nano-pillars can be formed on top of a substrate 508.

When currents are electrically injected into the pillars, light is emitted from each individual MQW regions 408 embedded within each nano-pillar. However, as the MQWs in the pillars are of different diameters and thus different degrees of strain relaxation, the emission wavelength would be different according to the diameter. FIG. 6 shows a plot of emission wavelength for nano-pillars with a range of diameters of between 800 nm to 4 µm, patterned by ion beam etching, whereby spectral blue shifts as large as 60 nm are observed.

By designing nano-pillars with a wide range of diameters, the emission spectra from the nano-pillars will overlap to form a broadband and continuous spectrum, corresponding to white light. Using this method, homogenous white light can be emitted without the need for color conversion.

All patents, patent applications, provisional applications, and publications referred to or cited herein are incorporated by reference in their entirety, including all figures and tables, to the extent they are not inconsistent with the explicit teachings of this specification.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all implementations falling within the scope of the appended claims, and equivalents thereof.

What is claimed is:

1. A semiconductor light-emitting diode, comprising:
   a light-emitting region, wherein the light-emitting region comprises an array of non-uniformly-sized nano-pillars formed using a top-down approach, and wherein the array of non-uniformly-sized nano-pillars have substantially uniform heights.

2. The semiconductor light-emitting diode according to claim 1, wherein the non-uniformly-sized nano-pillars are patterned by nanosphere lithography using a colloidal solution containing nanospheres of different diameters.

3. The semiconductor light-emitting diode according to claim 2, wherein the nanospheres comprise at least one etch resistant material selected from the group consisting of silica and alumina.

4. The semiconductor light-emitting diode according to claim 2, wherein the nanosphere colloidal solution is dispersed onto the surface of an LED wafer or chip into a monolayer.

5. The semiconductor light-emitting diode according to claim 4, wherein the monolayer of nanospheres is dispersed using at least one technique selected from the group consisting of: spin-coating, vertical deposition, and jet-printing.

6. The semiconductor light-emitting diode according to claim 1, wherein the non-uniformly-sized nano-pillars are patterned by electron beam lithography, ion beam lithography, optical lithography, or nanoimprint lithography, and wherein the diameters of the non-uniformly-sized nano-pillars range from 800 nm to 4 μm.

7. The semiconductor light-emitting diode according to claim 1, wherein the non-uniformly-sized nano-pillars are cylindrical.

8. The semiconductor light-emitting diode according to claim 1, wherein the non-uniformly-sized nano-pillars are suitable for emitting light by way of a strain relaxation method, wherein the strain profile is modified by etching through quantum wells.

9. The semiconductor light-emitting diode according to claim 1, further comprising:
a substrate, wherein the substrate comprises at least one of sapphire or silicon; and
highly-strained GaN-based LED structures grown on the substrate and having InGaN/GaN quantum wells as light-emitting regions,
wherein the non-uniformly-sized nano-pillars are formed on the highly-strained GaN-based LED structures, and
wherein the non-uniformly-sized nano-pillars have heights such that the light-emitting regions of the LED structure are embedded within the pillars.

10. The semiconductor light-emitting diode according to claim 1, wherein the array of non-uniformly-sized nano-pillars are randomly positioned.

11. The semiconductor light-emitting diode according to claim 1, wherein the array of non-uniformly-sized nano-pillars have a continuous range of diameters resulting in the ability to emit a continuous broadband spectrum.

12. The semiconductor light-emitting diode according to claim 1, wherein the non-uniformly-sized nano-pillars are interconnected by planarization, wherein the planarization is performed by one or more processes selected from the group consisting of: gap-filling; the use of electrically conducting films; and through epitaxial lateral regrowth of a cap later across the pillar array.

13. The semiconductor light-emitting diode according to claim 1, wherein the non-uniformly-sized nano-pillars have planar quantum wells.

14. The semiconductor light-emitting diode according to claim 1, wherein the non-uniformly-sized nano-pillars have diameters ranging down to 50 nm.

15. The semiconductor light-emitting diode according to claim 1, wherein light emitted from each nano-pillar depends on strain relaxation and a diameter of the nano-pillar.

16. The semiconductor light-emitting diode according to claim 15, wherein wavelengths of light emitted from differently-sized nano-pillars overlap to provide a polychromatic emission.

17. The semiconductor light-emitting diode according to claim 16, wherein the polychromatic emission is controlled through a starting wafer material.

18. The semiconductor light-emitting diode according to claim 16, wherein polychromatic emission is controlled by dimensions of nanospheres used to pattern the nano-pillars.

19. The semiconductor light-emitting diode according to claim 16, wherein polychromatic emission is controlled by formation of nano-pillars having different strain relaxation.

20. The semiconductor light-emitting diode according to claim 1, wherein the nano-pillars are strain-relaxed and are configured to provide high internal quantum efficiencies and high light extraction efficiencies.

21. The semiconductor light-emitting diode according to claim 1, wherein the nano-pillars are strain-relaxed, and wherein emissions from the strained relaxed nano-pillars result in reduced spectral shifts with respect to varying injection currents.

22. A semiconductor light-emitting diode, comprising:
a light-emitting region, wherein the light-emitting region comprises an array of non-uniformly-sized nano-pillars formed using a top-down approach,
wherein the array of non-uniformly-sized nano-pillars have substantially uniform heights,
wherein the non-uniformly-sized nano-pillars are cylindrical,
wherein the non-uniformly-sized nano-pillars are randomly positioned, and
wherein the non-uniformly-sized nano-pillars are suitable for emitting light by way of a strain relaxation method.

23. The semiconductor light-emitting diode according to claim 22, wherein the array of non-uniformly-sized nano-pillars have a continuous range of diameters, between 800 nm to 4 μm, resulting in the ability to emit a continuous broadband spectrum, and
wherein the of non-uniformly-sized nano-pillars have planar quantum wells.

24. The semiconductor light-emitting diode according to claim 22, wherein the array of non-uniformly-sized nano-pillars have a continuous range of diameters, ranging down to 50 nm, resulting in the ability to emit a continuous broadband spectrum, and
wherein the of non-uniformly-sized nano-pillars have planar quantum wells.

* * * * *